(12) United States Patent
Roell

(10) Patent No.: US 6,900,634 B2
(45) Date of Patent: May 31, 2005

(54) MAGNETIC RESONANCE SPECTROSCOPY METHOD

(75) Inventor: Stefan Roell, Moehrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/078,852

(22) Filed: Feb. 19, 2002

(65) Prior Publication Data

US 2002/0153892 A1 Oct. 24, 2002

(30) Foreign Application Priority Data

Feb. 21, 2001 (DE) ......................................... 101 08 341

(51) Int. Cl.[7] ............................................. G01V 3/00
(52) U.S. Cl. .................................................... 324/309
(58) Field of Search ................................. 324/309, 307, 324/310, 311, 312, 318, 322; 128/653, 153.2

(56) References Cited

U.S. PATENT DOCUMENTS

| | | | | |
|---|---|---|---|---|
| 4,480,228 A | | 10/1984 | Bottomley | 324/309 |
| 4,698,592 A | * | 10/1987 | Feinberg | 324/309 |
| 5,010,300 A | * | 4/1991 | Paley et al. | 324/309 |
| 5,172,060 A | * | 12/1992 | Knuttel | 324/307 |
| 5,528,145 A | * | 6/1996 | Hirata et al. | 324/309 |
| 5,955,883 A | | 9/1999 | Hennig | 324/307 |

FOREIGN PATENT DOCUMENTS

DE 199 62 850 7/2001
EP 0 270 320 * 11/1987 .......... G01N/24/08

OTHER PUBLICATIONS

Ernst et al; Improved water suppression for localized in vivo spectroscopy. Journal of Magnetic Resonance vol. 106 B pp 181–186 (1995).*

* cited by examiner

Primary Examiner—Edward Lefkowitz
Assistant Examiner—Brij B. Shrivastav

(57) ABSTRACT

In a magnetic resonance spectroscopy method, an excitation RF pulse is emitted with simultaneous emission of a first gradient during an excitation segment having a time duration corresponding to a transmission duration of the excitation RF pulse, a first refocusing RF pulse is emitted that has a first phase with respect to the excitation RF pulse with simultaneous emission of a second gradient during a first refocusing segment that temporally immediately follows the excitation segment and has a time duration corresponding to a transmission duration of the first refocusing RF pulse, an intermediate segment is allowed to elapse immediately temporally following the first refocusing segment for, among other things, temporal positioning of a secondary spin echo, a second refocusing RF pulse is emitted that has a second phase with respect to the excitation RF pulse, with simultaneous emission of a third gradient during a second refocusing segment immediately temporally following the intermediate segment and having a time duration corresponding to a transmission duration of the second refocusing RF pulse, the secondary spin echo is acquired during an acquisition segment immediately temporally following the second refocusing segment, and the aforementioned steps are repeated with a variation of phases of the RF pulses corresponding to a phase cycle.

20 Claims, 3 Drawing Sheets

MAGNETIC RESONANCE SPECTROSCOPY METHOD

BACKGROUND OF THE INVENTION

1. Field of the Invention

The present invention is directed to a magnetic resonance spectroscopy method.

2. Description of the Prior Art

Magnetic resonance spectroscopy has been employed for more than four decades in physical, chemical and biochemical basic research, for example as analysis technique or for obtaining structure information for complex molecules. Magnetic resonance spectroscopy, like magnetic resonance tomography, is based on the principle of magnetic nuclear resonance. The primary objective of spectroscopy, however, is not imaging but an analysis of a substance. Resonant frequencies of isotopes that have a magnetic moment, for example $^1H$, $^{13}C$ or $^{31}P$, are thereby dependent on the chemical structure the molecules wherein the isotopes are bonded. A determination of the resonant frequencies therefore allows a differentiation to be made between different substances. The signal intensity at the various resonant frequencies provides information about the concentration of the corresponding molecules.

When a molecule is introduced into a basic magnetic field of a magnetic resonance apparatus, as occurs in the case of spectroscopy, electrons of the molecule shield the basic magnetic field of atomic nuclei of the molecule. As a result of this effect, the local magnetic field changes at the location of an atomic nucleus by a few millionths of the external basic magnetic field. The variation of the resonant frequency of this atomic nucleus connected therewith is referred to as chemical shift. Molecules thus can be identified on the basis of their chemical shift. Since frequency differences are easier to acquire by measurements, and can be acquired more precisely, than absolute frequencies, the chemical shift is indicated relative to a reference signal, for example the operating frequency of the magnetic resonance apparatus, in ppm.

A resonance line of an atomic nucleus can be split into a number of lines when further atomic nuclei having a magnetic moment are located in the environment of the atomic nucleus under consideration. The reason for this is due to phenomenon referred to as spin-spin coupling between the atomic nuclei. The magnetic flux density of the basic magnetic field that an atomic nucleus experiences thus is not only dependent on the electronic shield around this atomic nucleus but is also dependent on the orientation of the magnetic fields of the neighboring atoms.

Clinical magnetic resonance spectroscopy means magnetic resonance spectroscopy upon employment of clinical magnetic resonance apparatus. Methods for localized magnetic resonance spectroscopy essentially differ from those of magnetic resonance imaging in that the chemical shift is resolved in the spectroscopy in addition to the tomographic, topical resolution. Currently, two localization methods of magnetic resonance spectroscopy are dominant for clinical application. These are individual volume techniques based on echo methods wherein a spectrum of a previously selected target volume is registered, and spectroscopic imaging methods, referred to as CSI methods (chemical shift imaging) that simultaneously enable the registration of spectra of many spatially interconnected target volumes.

Spectroscopic imaging methods are employed in clinical phosphorous spectroscopy as well as in proton spectroscopy. A three-dimensional CSI method can include the steps of following a non-slice-selected 90° RF pulse, activating a combination of magnetic phase-coding gradients of the three spatial directions for a defined time, and subsequently reading out the magnetic resonance signal in the absence of any and all gradients. This is repeated with different combinations of phase-coding gradients until the desired topical resolution has been achieved. A four-dimensional Fourier transformation of the magnetic resonance signals supplies the desired, spatial distribution of the resonance lines. A two-dimensional CSI method arises from the three-dimensional method set forth above by replacing the non-slice-selected RF pulse by a slice-selective excitation composed of slice-selected RF pulse and corresponding magnetic gradient and one phase-coding direction is eliminated.

The single-volume techniques that are usually applied are based on an acquisition of a stimulated echo or of a secondary spin echo. In both instances, a topical resolution ensues by successive selective excitations of three orthogonal slices. A target volume is thereby defined by a section volume of these three slices. Only a magnetization of the target volume interacts with all three selective RF pulses and thus contributes to the stimulated echo or secondary spin echo. The spectrum of the target volume is obtained by one-dimensional Fourier transformation of a time signal corresponding to the stimulated echo or to the secondary spin echo. Compared to the method based on a secondary spin echo, only one-half of a magnetization of the target volume is rephased in the method based on a stimulated echo. In order to obtain short echo times for the stimulated echo or secondary spin echo, the power capability of a RF system of the magnetic resonance apparatus is essentially relevant given the method based on a secondary spin echo, in contrast to which the power capability of a gradient system of the apparatus is additionally relevant in the method based on the stimulated echo. Significantly lower gradient intensities are thereby required given the method based on a secondary spin echo. Since, given the method based on a stimulated echo, gradients having comparatively high intensity must be activated for a short echo time even immediately before an acquisition of the stimulated echo, there is a high susceptibility to disturbances caused by eddy currents.

In the single-volume technique based on a secondary spin echo, the following signals can be fundamentally observed after the free RF pulses: a three induction decay of each RF pulse, a spin echo for each RF pulse pair, as well as the secondary spin echo and a stimulated echo from all three RF pulses together. Only the secondary spin echo is to be measured, and all other signals are blanked out. This can ensue by activating additional magnetic gradients are such that the magnetization from the target volume is completely rephased at the point in time of the acquisition of the secondary spin echo. By contrast, the magnetization of the remaining volume is completely dephased. Gradients referred to as spoiler gradients are utilized for this purpose. The spoiler gradients can be activated as separate gradient pulses or can be realized by a lengthened activation duration of slice selection gradients over a transmission duration of an appertaining RF pulse, as described, for example, in U.S. Pat. No. 4,480,228. Regarding the blanking out of unwanted signals, further, the article by J. Hennig "The Application of Phase Rottion for Localized in Vivo Proton Spectroscopy with Short Echo Times", Journal of Magnetic Resonance 96 (1992), pages 40 through 49, teaches that the phases of the three RF pulses be modified per repetition given a repeated registration of the secondary spin echo in conformity with a phase cycle. It is pointed out in the article that only the slice selection gradients in the two refocusing RF pulses are lengthened by 2 ms toward the leading back and trailing edges for spoiling in order to achieve short echo times. Other spoiler gradients are not activated.

Further, short echo times can be achieved with the ISIS method (image selected in vivo spectroscopy). The ISIS method is based on a sequence of eight non-selected 90° RF pulses with intervening, slice-selective 180° HF pulses. A 180° RF pulse for selecting slices is utilized three times, two 180° RF pulses for selecting line elements are utilized twice and three 180° RF pulses for selecting a target volume element are utilized once between two of the 90° RF pulses. Magnetic resonance signals are acquired following each 90° RF pulse, these magnetic resonance signals being subtracted or added for forming a signal that relates exclusively to the target volume element. One particular difficulty in the ISIS method results from the fact that—for an accurate determination of signal parts that relate exclusively to the target volume element—signal components of the other, generally much larger, overall volume must cancel exactly in the subtractions and additions. As a result, the ISIS method is very susceptible to even the minutest movements of the examination volume. Further details regarding the ISIS method are described, for example, in the article by R. J. Ordidge et al. "Image-Selected in Vivo Spectroscopy (ISIS). A New Technique for Spatially Selective NMR Spectroscopy", Journal of Magnetic Resonance 66 (1986), pages 283 through 294.

The intense water signals are often suppressed in clinical proton spectroscopy. One method for such water suppression is, for example, the CHESS technique, whereby the nuclear spins of the water molecules are first selectively excited by narrow-band 90° RF pulses and their cross-magnetization is subsequently dephased by activating magnetic field gradients. In the ideal case, no detectable magnetization of the water molecules thus is available for an immediately following spectroscopy method.

SUMMARY OF THE INVENTION

An object of the present invention is to provide an improved magnetic resonance spectroscopy method with which very short echo times can be realized, among other things for a magnetic resonance signal that is used for the formation of a magnetic resonance spectrum.

This object is achieved by a magnetic resonance spectroscopy method according to the invention wherein an excitation RF pulse is emitted with simultaneous emission of a first gradient during an excitation segment having a time duration corresponding to a transmission duration of the excitation RF pulse, a first refocusing RF pulse is emitted that has a first phase with respect to the excitation RF pulse with simultaneous emission of a second gradient during a first refocusing segment that temporally immediately follows the excitation segment and has a time duration corresponding to a transmission duration of the first refocusing RF pulse, an intermediate segment is allowed to elapse immediately temporally following the first refocusing segment for, among other things, temporal positioning of a secondary spin echo, a second refocusing RF pulse is emitted that has a second phase with respect to the excitation RF pulse, with simultaneous emission of a third gradient during a second refocusing segment immediately temporally following the intermediate segment and having a time duration corresponding to a transmission duration of the second refocusing RF pulse, the secondary spin echo is acquired during an acquisition segment immediately temporally following the second refocusing segment, and the aforementioned steps are repeated with a variation of phases of the RF pulses corresponding to a phase cycle.

Due to instability of a RF system of a modern magnetic resonance apparatus for sending RF pulses and receiving magnetic resonance signals, a complete blanking out of all unwanted signal contributions from outside a target volume can be achieved merely by means of the phase cycle. Thus, spoiling both due to separate spoiler gradients as well as to slice selection gradients that are lengthened beyond a transmission duration of an appertaining RF pulse can be foregone. As a result the secondary spin echo can be registered with a shortest possible echo time. A spectrum of the secondary spin echo having the shortest possible echo time offers the following advantages: signal components having short $T_2$ relaxation times can be acquired. A $T_2$ weighting of the spectrum becomes smaller, as a result of which the spectrum can be more precisely quantified. This is particularly advantageous given pathological tissues wherein the $T_2$ relaxation times of metabolites vary greatly and are generally unknown. Further, dephasing influences of spin-spin couplings are reduced and thus signal components subjected to the couplings can be more easily interpreted in the spectrum.

In one embodiment, the time duration of the excitation segment is lengthened by a shut-off event of the first gradient or a turn-on event of the second gradient and/or the time duration of the second refocusing segment is lengthened by a shut-off event of the third gradient. Such lengthenings, due to a gradient system of the apparatus, are determined, minimal, optimally zero-proximate time durations in order, proceeding from a value for one of the slice selections, to bring an intensity of a gradient to zero or vice versa. The turn-on and shut-off events are conditioned in purely device-oriented terms. Due to their zero-proximate time duration and compared to the slice selection having slight moderate gradient intensity, they do not act as spoiler gradients.

In another embodiment, at least seven repetitions are implemented and the RF pulses with respect to the excitation RF pulse of a $0_{th}$ repetition, to which a phase of 90° is allocated, are emitted with the following phases:

| | Excitation RF Pulse | First Refocusing RF Pulse | Second Refocusing RF Pulse |
| --- | --- | --- | --- |
| $0^{th}$ Repetition | 90° | 0° | 90° |
| $1^{st}$ Repetition | 90° | 90° | 180° |
| $2^{nd}$ Repetition | 90° | 180° | 270° |
| $3^{rd}$ Repetition | 90° | 270° | 0° |
| $4^{th}$ Repetition | 270° | 0° | 0° |
| $5^{th}$ Repetition | 270° | 90° | 90° |
| $6^{th}$ Repetition | 270° | 180° | 180° |
| $7^{th}$ Repetition | 270° | 270° | 270° |

The phase cycle of eight excitation RF pulses including appertaining refocusing RF pulses is the shortest with which all unwanted signal parts can be blanked out. An addition of the eight secondary spin echos generated by the individual excitation RF pulses thus yields a summed secondary spin echo that is free of signal components deriving from outside the target volume. Since, given a comparable, traditional single-volume technique based on a secondary spin echo, for example, 128 secondary spin echos of the same target volume must be registered in order to achieve an adequate signal-to-noise ratio, the aforementioned repetitions are not disadvantageous in view of an overall measurement time, since sixteen repetitions of the phase cycle—i.e. summa summarum 128 secondary spin echo excitations as well—are to be implemented anyway for achieving an identical signal-to-ratio.

DESCRIPTION OF THE PREFERRED EMBODIMENTS

Figure 1:
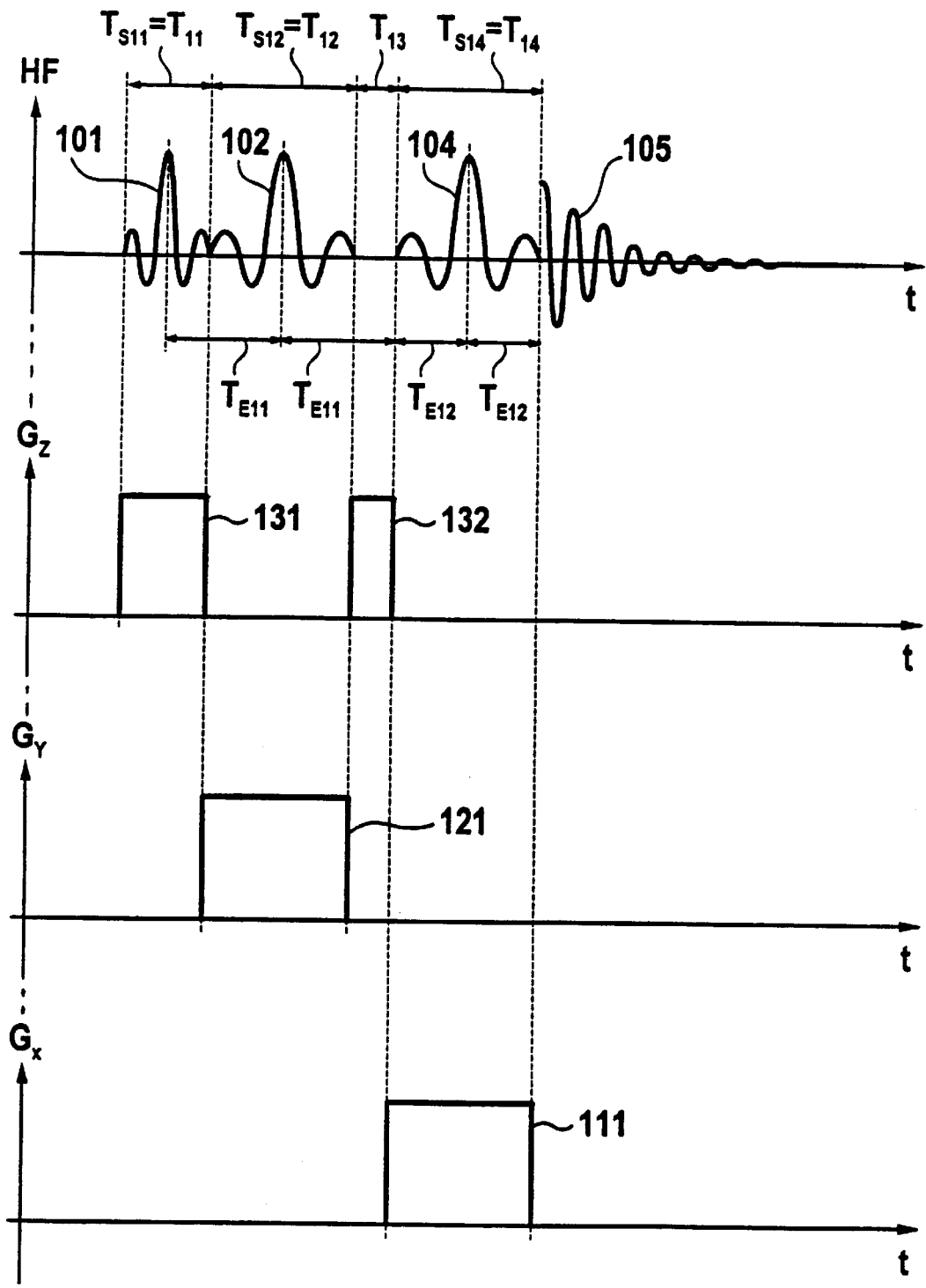
FIG. 1 illustrates an RF pulse and gradient pattern having idealized square-wave gradient pulses in accordance with the invention.

As an exemplary embodiment of the invention, FIG. 1 shows a RF pulse and gradient pattern having idealized, square-wave gradient pulses. In a first time sequence are an excitation RF pulse 101 having a transmission duration $T_{S11}$, a first refocusing RF pulse 102 having a transmission duration $T_{S12}$, a second refocusing RF pulse 104 having a transmission duration $T_{S14}$ and a secondary spin echo 105. The slice-selective excitation RF pulse 101 is configured such that it causes a flip angle of 90°. The likewise slice-selective refocusing RF pulses 102 and 104 each effect a flip angle of 180°. For corresponding slice selection, a gradient pulse 131 of a gradient $G_z$ is applied in a first direction during the transmission duration $T_{S11}$, a gradient pulse 121 of a gradient $G_y$ is applied in a second direction during the transmission duration $T_{S12}$, and a gradient pulse 111 of a gradient $G_x$ is applied in a third direction during the transmission duration $T_{S14}$. The gradient pulses 111, 121 and 131 have an optimally temporally constant gradient intensity during the appertaining transmission durations $T_{S14}$, $T_{S12}$ and $T_{S11}$. A section volume of the three slices thereby defines a target volume, from which the secondary spin echo 105 is acquired.

The transmission duration $T_{S11}$ of the excitation RF pulses 101 is thereby equal to a time duration $T_{11}$ of an excitation segment; the transmission duration $T_{S12}$ of the first refocusing RF pulse 102 is equal to a time duration $T_{12}$ of a first refocusing segment; and the transmission duration $T_{S14}$ of the second refocusing RF pulse 104 is equal to a time duration $T_{14}$ of a second refocusing segment. A further time duration $T_{13}$ of an intermediate segment is thereby configured such that a maximum of the secondary spin echo 105 is positioned immediately following an end of the time duration $T_{14}$ of the second refocusing RF pulse 104. The segments immediately follow one another in time.

The secondary spin echo 105 is generated by the second refocusing RF pulse 105 from a primary spin echo that is in turn a consequence of the excitation RF pulse 101 in combination with the first refocusing RF pulse 102. The maximum of the secondary spin echo 105 is then positioned at the end of the time duration $T_{14}$ when a maximum of the primary spin echo occurs at the beginning of the time duration $T_{14}$. The maximum of the primary spin echo occurs after a first echo half-time $T_{E11}$ following a maximum of the first refocusing RF pulse 102, whereby the first echo half-time $T_{E11}$ is defined by a time interval between the maximum of the first refocusing RF pulse 102 and a maximum of the excitation RF pulse 101. The first echo half-time $T_{E11}$ is therefore equal to one-half the sum of the time durations $T_{11}$ and $T_{12}$. An echo time of the secondary spin echo thus derives from a sum of double the first echo half-time $T_{E11}$ plus double a second echo half-time $T_{E12}$ that is equal to one-half of the time duration $T_{14}$. For the positioning of the maximum of the secondary spin echo 105, accordingly, the time duration $T_{13}$ of the intermediate segment is to be set as half the time duration $T_{11}$ of the excitation segment. For refocusing the 90° excitation during the time duration $T_{11}$, the intermediate segment is utilized for applying a corresponding refocusing gradient pulse 132 whose gradient time area roughly corresponds to one-half of a gradient time area of the gradient pulse 131.

The excitation RF pulse 101 is emitted with an arbitrarily definable phase of, for example, 90°. With respect thereto, the first refocusing RF pulse 102 is emitted with a phase of 0°, and the second refocusing RF pulse 104 is sent with a phase of 90°. The above-described RF pulse and gradient pattern is repeated at least seven times, with the following phase cycle being adhered to for the phases of the RF pulses:

|  | Excitation RF Pulse | First Refocusing RF Pulse | Second Refocusing RF Pulse |
| --- | --- | --- | --- |
| 1st Repetition | 90° | 90° | 180° |
| 2nd Repetition | 90° | 180° | 270° |
| 3rd Repetition | 90° | 270° | 0° |
| 4th Repetition | 270° | 0° | 0° |
| 5th Repetition | 270° | 90° | 90° |
| 6th Repetition | 270° | 180° | 180° |
| 7th Repetition | 270° | 270° | 270° |

The secondary spin echos acquired for the eight excitations are finally added up and thus yield a summed secondary spin echo that is free of signal components from outside the target volume that superimpose on the individual secondary spin echos. For enhancing a signal-to-noise ratio, the aforementioned phase cycle can be multiply repeated. In the above-described phase cycle, each of the secondary spin echos can be registered by a RF system of a magnetic resonance apparatus with an identical setting for a phase reference point. In other phase cycles, the phase reference point is to be switched back and forth, for example, between 0° and 180° from secondary spin echo to secondary spin echo.

Figure 2:
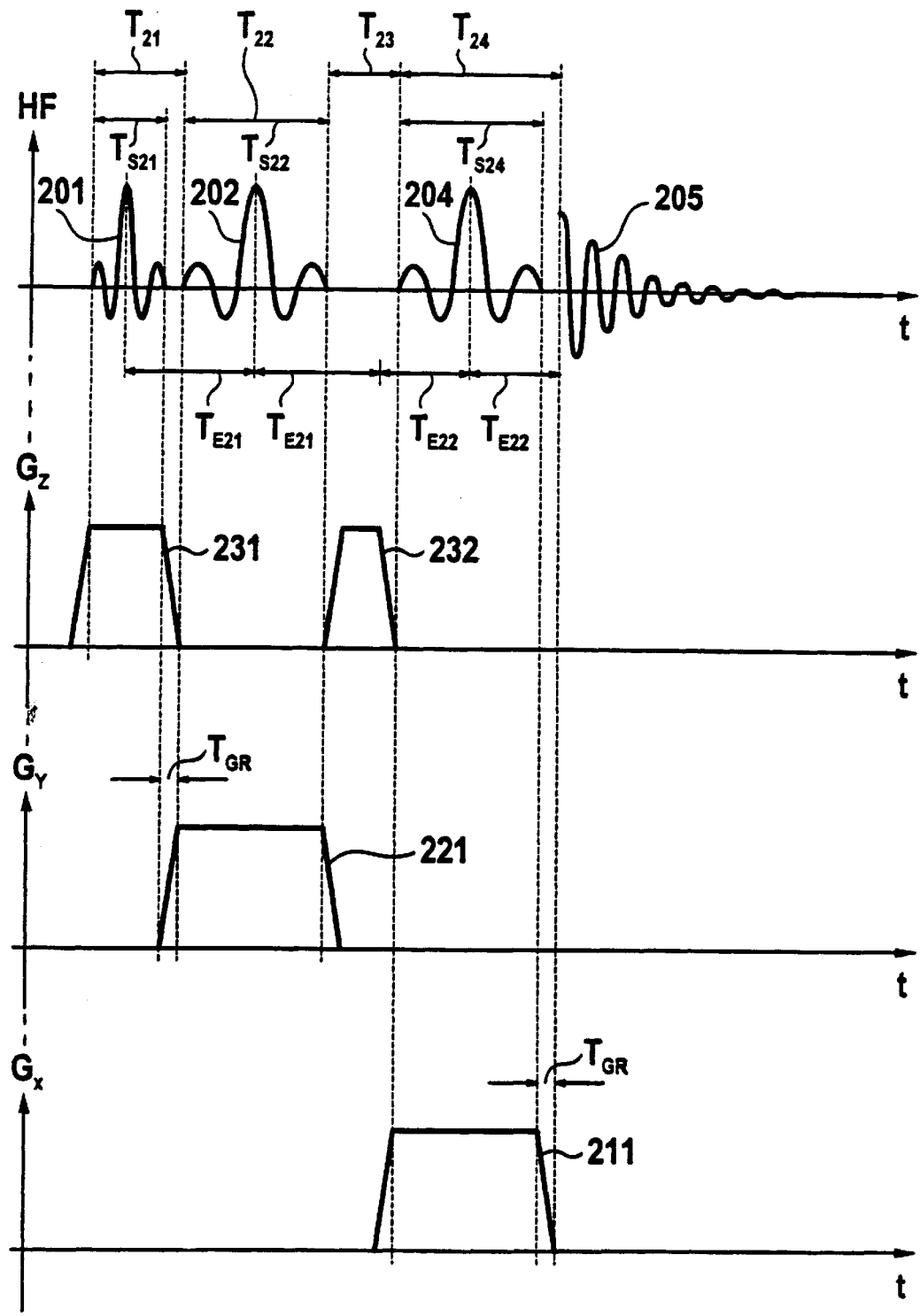
FIG. 2 illustrates an RF pulse and gradient pattern having trapezoidal gradient pulses in accordance with the invention.

As a further exemplary embodiment of the invention, FIG. 2 shows a RF pulse and gradient pattern having trapezoidal gradient pulses. The pattern of FIG. 2 proceeds from the pattern of FIG. 1 in that the idealized square-wave gradient pulses of FIG. 1 are turned into trapezoidal pulses by attaching corresponding leading and trailing ramps, the trapezoidal gradient pulses being able to be implemented with a gradient system. An excitation RF pulse 201 having a transmission duration $T_{S21}$, a first refocusing RF pulse 202 having a transmission duration $T_{S22}$ and a second refocusing RF pulse 204 having the transmission duration $T_{S24}$ correspond to the RF pulses 101, 102 and 104 as well as to the transmission durations $T_{S11}$, $T_{S12}$ and $T_{S14}$ of FIG. 1. The gradient pulses 211, 221, 231 and 232 exhibit—compared to the gradient pulses 111, 121, 131 and 132 of FIG. 1—additional turn-on and turn-off ramps having a ramp duration of $T_{GR}$. The ramp durations $T_{GR}$ are time durations dependent on the basis of the gradient system and are optimally zero-proximate.

As a result of the ramp durations $T_{GR}$, a time duration $T_{21}$ of an excitation segment in FIG. 2 derives as a sum of the transmission duration $T_{S21}$ and the ramp duration $T_{GR}$.

Correspondingly, a time duration $T_{24}$ of a second refocusing segment derives from a lengthening of the transmission duration $T_{S24}$ by the ramp duration $T_{GR}$. Given positioning of a maximum of a secondary spin echo 205 immediately at the end of the time duration $T_{24}$, a time duration $T_{23}$ of an intermediate segment is lengthened by two ramp durations $T_{GR}$ compared to the time duration $T_{13}$ of FIG. 1. Correspondingly, a first echo half-time $T_{E21}$ and a second echo half-time $T_{E22}$ compared to the half-times $T_{E11}$ and $T_{E12}$ of FIG. 1 are each lengthened by a ramp duration $T_{GR}$. A time duration $T_{22}$ of a first refocusing segment remains unmodified compared to the time duration $T_{12}$ of FIG. 1. Moreover, the description regarding FIG. 1 applies to FIG. 2. Given a local RF antenna for sending the RF pulses 201, 202 and 204 as well as for picking up the secondary spin echo 205, 2.6 ms derives for the transmission durations $T_{S22}$ and $T_{S24}$ given, for example, 0.8 ms for the transmission duration $T_{S21}$, and an echo time of 6.4 ms for the secondary spin echo [derives given] 0.1 ms for the ramp durations $T_{GR}$.

Figure 3:
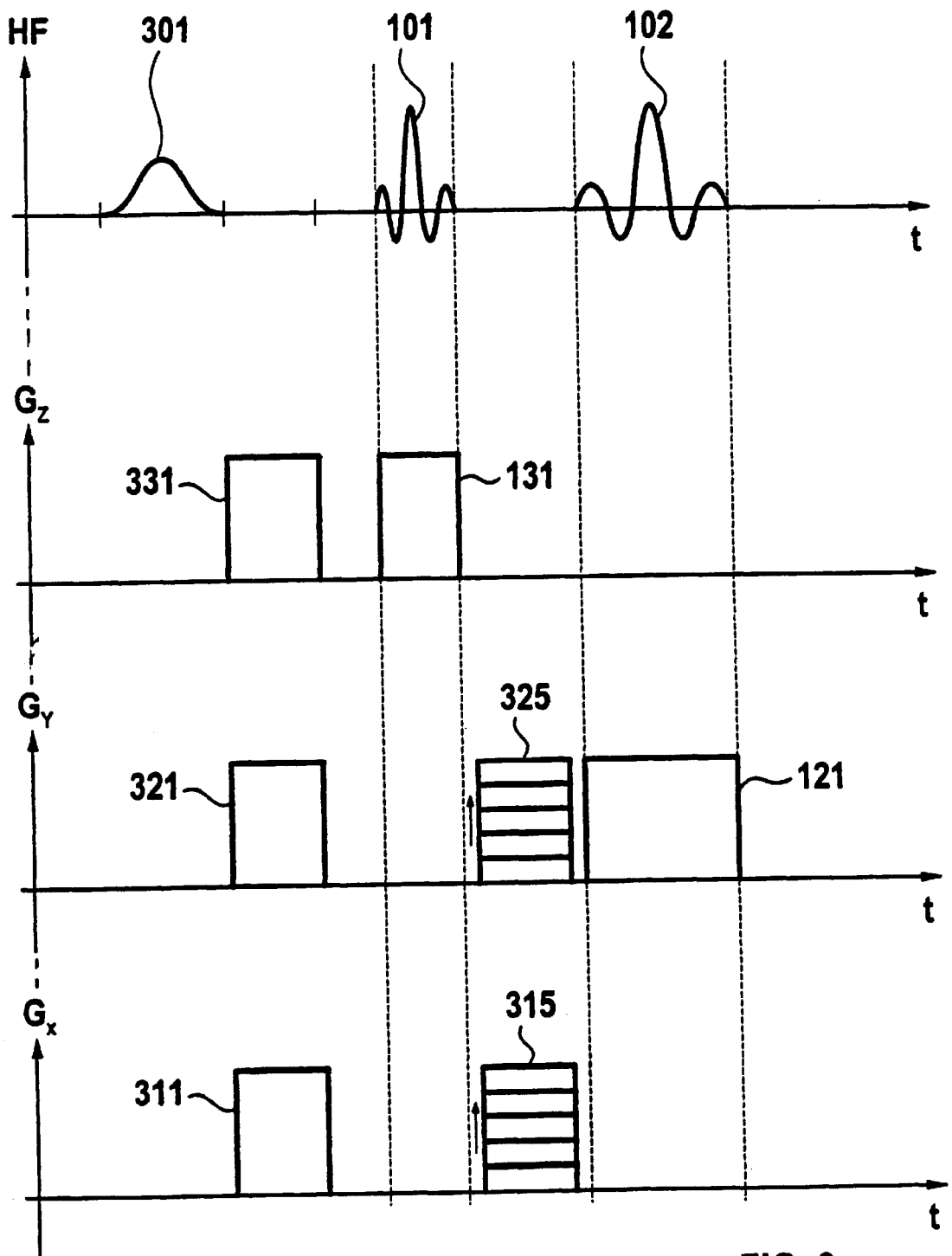
FIG. 3 illustrates a portion of the RF pulse and gradient pattern shown in FIG. 1 with an additional water suppression and phase-coding gradient.

As a further exemplary embodiment of the invention, FIG. 3 shows an excerpt from the pattern of FIG. 1 that is expanded by pulses for suppressing magnetic resonance signals from a specific frequency or of a specific frequency range and by phase code gradient pulses. To that end, the water molecules are selectively excited with a narrow-band 90° excitation RF pulse 301 temporally preceding the pattern of FIG. 1 for suppressing, for example, the intense water signals, and their cross-magnetization is subsequently dephased by spoiler gradient pulses 311, 321 and 331. For expanding the single-volume technique described in FIG. 1 to form a hybrid method composed of single-volume technique and CSI method, phase-coding gradient pulses 315 and 325 are inserted between the excitation segment and the first refocusing segment. In addition to the repetitions of the phase cycle for achieving a desired topical resolution, the pattern expanded by the phase-coding gradient pulses 315 and 325 is thereby to be repeated with a corresponding number of phase-coding steps.

Although modifications and changes may be suggested by those skilled in the art, it is in the intention of the inventor to embody within the patent warranted hereon all changes and modifications as reasonably and properly come within the scope of his contribution to the art.

I claim as my invention:

1. A magnetic resonance spectroscopy method comprising the steps of:
   (a) emitting an excitation RF pulse with simultaneous generation of a first gradient during an excitation segment having a time duration corresponding to a duration of said excitation RF pulse;
   (b) emitting a first refocusing RF pulse, having a first phase relative to said excitation RF pulse, and simultaneously generating a second gradient during a first refocusing segment that immediately follows said excitation segment and has a time duration corresponding to a duration of said first refocusing RF pulse;
   (c) allowing an intermediate segment to elapse immediately following said first refocusing segment for temporally positioning a secondary spin echo;
   (d) emitting a second refocusing RF pulse having a second phase relative to said excitation RF pulse and simultaneously generating a third gradient during a second refocusing segment immediately following said intermediate segment and having a time duration corresponding to a duration of said second refocusing RF pulse;
   (e) acquiring said secondary spin echo during an acquisition segment immediately following said second refocusing segment; and
   (f) repeating steps (a) through (e) and in respective repetitions varying the respective phases of said excitation RF pulse, said first refocusing RF pulse and said second refocusing RF pulse according to a phase cycle.

2. A method as claimed in claim 1 comprising lengthening the time duration of the excitation segment by an event selected from the group consisting of a shut-off event of said first gradient and a turn-on event of said second gradient.

3. A method as claimed in claim 1 comprising lengthening the time duration of the second refocusing segment by a shut-off event of said third gradient.

4. A method as claimed in claim 1 wherein each of said RF excitation pulse, said first RF refocusing pulse and said second RF refocusing pulse excites magnetic resonance signals, and wherein a target volume exists wherein all of said excitation RF pulse, said first refocusing RF and said second refocusing RF pulse are effective, and selecting said phase cycle so that magnetic resonance signals excited by said excitation RF pulse, said first refocusing RF pulse and said second refocusing RF pulse outside of said target volume are blanked out.

5. A method as claimed in claim 1 comprising initially emitting said excitation RF pulse with a 90° phase, initially emitting said first refocusing pulse with said first phase equal to 0°, and initially emitting said second refocusing RF pulse with said second phase equal to 90°, and wherein step (f) comprises repeating steps (a) through (e) seven times wherein, in a first repetition, said excitation RF pulse has a 90° phase, said first phase is 90° and said second phase is 180°, in a second repetition said excitation RF pulse has a 90° phase, said first phase is 180° and said second phase is 270°, in a third repetition said excitation RF pulse has a 90° phase, said first phase is 270° and said second phase is 0°, in a fourth repetition said excitation RF pulse has a 270° phase, said first phase is 0° and said second phase is 0°, in a fifth repetition said excitation RF pulse has a 270° phase, said first phase is 90° and second phase is 90°, in a sixth repetition, said excitation RF pulse has a 270° phase, said first phase is 180° and said second phase is 180°, and in a seventh repetition said excitation RF pulse has a 270° phase, said first phase is 270° and second phase is 270°.

6. A method as claimed in claim 1 comprising processing the secondary spin echos respectively acquired in the repetitions in common.

7. A method as claimed in claim 6 wherein the step of processing the secondary spin echos comprises adding said secondary spin echos together.

8. A method as claimed in claim 1 wherein said intermediate segment contains a shut-off event of said second gradient.

9. A method as claimed in claim 1 wherein said intermediate segment contains a turn-on event of said third gradient.

10. A method as claimed in claim 1 comprising, in said intermediate segment, rephasing said first gradient with respect to the first gradient generated in said excitation segment.

11. A method as claimed in claim 1 wherein said secondary spin echo has a maximum, and comprising selecting said time duration of said intermediate segment so that said maximum occurs immediately after an end of the time duration of the second refocusing segment.

12. A method as claimed in claim 1 wherein step (a) includes generating said first gradient in a first direction, wherein step (b) includes generating said second gradient in a second direction, and wherein step (d) includes generating said third gradient in a third direction.

13. A method as claimed in claim 12 wherein said first, second and third directions are orthogonal.

14. A method as claimed in claim 1 comprising generating one of said first gradient, said second gradient and said third gradient as a substantially temporally constant gradient.

15. A method as claimed in claim 1 wherein step (a) comprises generating said excitation RF pulse with a flip angle of 90°.

16. A method as claimed in claim 1 comprising generating at least one of said first refocusing RF pulse and said second refocusing RF pulse with a flip angle of 180°.

17. A method as claimed in claim 1 comprising the additional step, preceding step (a) of suppressing magnetic resonance signals within a predetermined frequency range.

18. A method as claimed in claim 1 comprising the additional step, preceding step (a) of suppressing magnetic resonance signals of a predetermined frequency.

19. A method as claimed in claim 1 comprising the additional step, preceding step (a) of suppressing magnetic resonance signals from water molecules.

20. A method as claimed in claim 1 comprising the additional step of generating phase-coding gradients between said excitation segment and said first refocusing segment to allow spectroscopic imaging.

* * * * *